(12) United States Patent
Biragoni et al.

(10) Patent No.: US 10,015,914 B2
(45) Date of Patent: Jul. 3, 2018

(54) ENCLOSURES AND METHODS OF MANAGING HEAT IN HEAT GENERATING MODULES

(71) Applicant: Emerson Network Power, Energy Systems, North America, Inc., Warrenville, IL (US)

(72) Inventors: Arunkumar Biragoni, Godavarikhani (IN); Adarsh Khandelwal, Pune (IN)

(73) Assignee: VERTIV ENERGY SYSTEMS, INC., Lombard, IL (US)

( * ) Notice: Subject to any disclaimer, the term of this patent is extended or adjusted under 35 U.S.C. 154(b) by 0 days.

(21) Appl. No.: 15/017,198

(22) Filed: Feb. 5, 2016

(65) Prior Publication Data

US 2016/0234974 A1 Aug. 11, 2016

(30) Foreign Application Priority Data

Feb. 5, 2015 (IN) .......................... 380/MUM/2015

(51) Int. Cl.
*H05K 7/20* (2006.01)
*H02B 1/56* (2006.01)

(52) U.S. Cl.
CPC ......... *H05K 7/20909* (2013.01); *H05K 7/206* (2013.01); *H02B 1/565* (2013.01); *H05K 7/20572* (2013.01)

(58) Field of Classification Search
CPC ....... H05K 7/20572–7/20581; H05K 7/20736; H05K 7/20754; H05K 7/20909; H05K 7/206; H05K 5/0213; H02B 1/56–1/565

USPC ............... 361/695, 679.49, 679.51; 454/184; 312/236
See application file for complete search history.

(56) References Cited

U.S. PATENT DOCUMENTS

| | | | |
|---|---|---|---|
| 4,807,441 A | 2/1989 | Agee et al. | |
| 5,864,365 A * | 1/1999 | Sramek | ................ H04N 5/2252 348/373 |
| 6,000,464 A | 12/1999 | Scafidi et al. | |
| 6,209,631 B1 | 4/2001 | Garcia-Ortiz | |
| 6,877,551 B2 * | 4/2005 | Stoller | .................. H02B 1/565 165/122 |
| 7,161,803 B1 | 1/2007 | Heady | |
| 7,222,660 B2 | 5/2007 | Giacoma et al. | |
| 7,319,589 B1 | 1/2008 | Heady | |
| 7,327,578 B2 | 2/2008 | Novotny | |

(Continued)

*Primary Examiner* — Zachary M Pape
(74) *Attorney, Agent, or Firm* — Harness, Dickey & Pierce, P.L.C.

(57) ABSTRACT

An example enclosure includes a top portion, a bottom portion, and at least one heat generating module adjacent the top portion of the enclosure. The heat generating module includes an inlet side, an outlet side, a heat generating component and an internal fan. The enclosure also includes a heat collector positioned adjacent the outlet side of the heat generating module to collect warm air from the outlet side of the heat generating module and divert the warm air to the bottom portion of the enclosure to mix with cooler air. The internal fan of the heat generating module draws the mixed air into the heat generating module to create an airflow loop within the enclosure to cool the heat generating component without a heat sink, a heat exchanger, or a fan external to the heat generating module. Other example enclosures and methods of managing heat inside enclosures are also disclosed.

20 Claims, 2 Drawing Sheets

(56) References Cited

U.S. PATENT DOCUMENTS

| | | |
|---|---|---|
| 7,418,995 B2 | 9/2008 | Howard et al. |
| 7,542,287 B2 | 6/2009 | Lewis, II et al. |
| 7,826,216 B2 * | 11/2010 | Moss ................. H05K 7/20736 |
| | | 361/679.48 |
| 7,952,869 B2 | 5/2011 | Lewis, II et al. |
| 8,040,673 B2 | 10/2011 | Krietzman |
| 8,096,861 B2 | 1/2012 | Hanafusa |
| 8,542,485 B2 | 9/2013 | Nemoz et al. |
| 8,737,068 B2 | 5/2014 | Krietzman et al. |
| 2008/0070492 A1 | 3/2008 | Koch et al. |
| 2008/0137296 A1 * | 6/2008 | DuQuette .............. H05K 7/206 |
| | | 361/695 |
| 2009/0086434 A1 | 4/2009 | Hodes et al. |
| 2011/0207392 A1 | 8/2011 | Ebermann et al. |
| 2013/0133350 A1 | 5/2013 | Reytblat |
| 2013/0267162 A1 | 10/2013 | Hung |
| 2013/0286587 A1 | 10/2013 | Martini |
| 2015/0116929 A1 * | 4/2015 | Shabbir ............. H05K 7/20836 |
| | | 361/679.48 |

\* cited by examiner

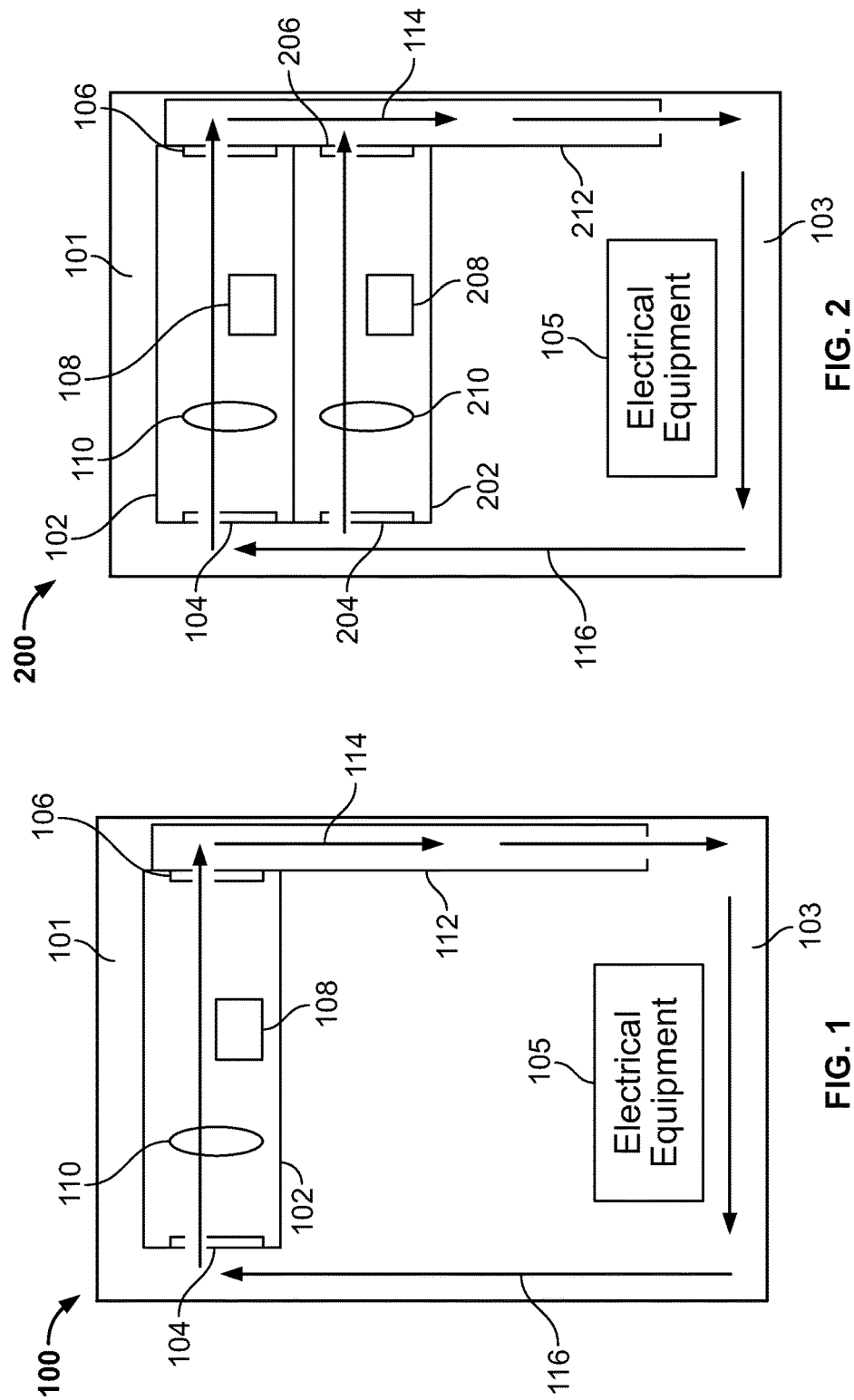

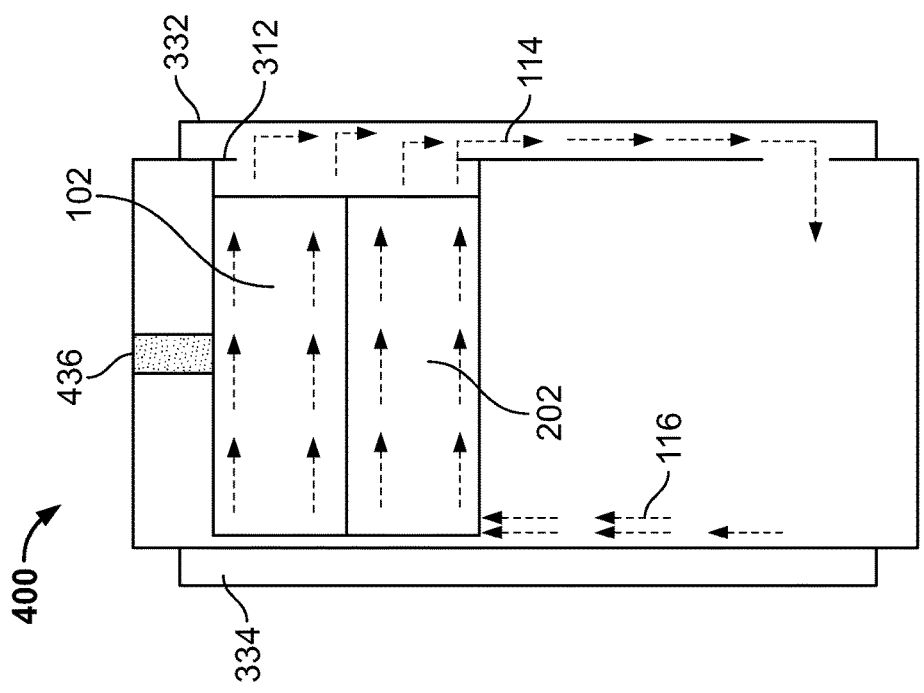
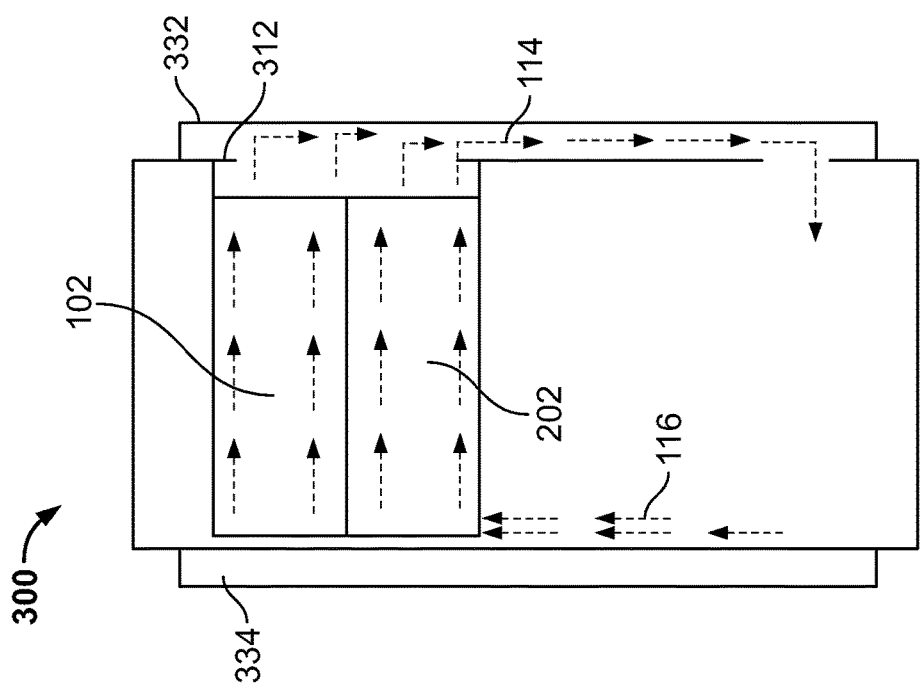

ENCLOSURES AND METHODS OF MANAGING HEAT IN HEAT GENERATING MODULES

CROSS-REFERENCE TO RELATED APPLICATION

This application claims the benefit and priority of Indian Patent Application No. 380/MUM/2015 filed Feb. 5, 2015. The entire disclosure of the above application is incorporated herein by reference.

FIELD

The present disclosure relates to enclosures and methods of managing heat in heat generating modules.

BACKGROUND

This section provides background information related to the present disclosure which is not necessarily prior art.

Some power systems may include heat generating modules (e.g., rectifier modules, etc.) disposed within enclosures (e.g., cabinets, etc.). For example, rectifier modules may be configured to convert alternate current (AC) from a power grid and supply direct current (DC) to a load. Each rectifier module may have some power losses dissipated as heat, which may remain in the cabinet and lead to higher cabinet temperatures that may cause other components within the cabinet to malfunction, become inoperable, etc.

SUMMARY

This section provides a general summary of the disclosure, and is not a comprehensive disclosure of its full scope or all of its features.

According to one aspect of the present disclosure, an example enclosure includes a top portion, a bottom portion opposing the top portion, and at least one heat generating module adjacent the top portion of the enclosure. The heat generating module includes an inlet side, an outlet side, a heat generating component and an internal fan. The enclosure also includes a heat collector positioned adjacent the outlet side of the heat generating module. The heat collector is configured to collect warm air from the outlet side of the heat generating module and divert the warm air to the bottom portion of the enclosure to mix with cooler air. The internal fan of the heat generating module is configured to draw the mixed air into the inlet side of the heat generating module to create an airflow loop within the enclosure to cool the heat generating component without a heat sink, a heat exchanger, or a fan disposed within the enclosure and external to the heat generating module.

According to another aspect of the present disclosure, an example method of managing heat inside an enclosure is disclosed. The enclosure includes a heat generating module and a heat collector adjacent an outlet side of the heat generating module. The method includes collecting warm air with the heat collector from the outlet side of the heat generating module, diverting the warm air with the heat collector to a bottom portion of the enclosure to mix with cooler air, and drawing the mixed air into the heat generating module via an interior fan of the heat generating module to create an airflow loop within the enclosure to cool the heat generating component without a heat sink, a heat exchanger, or a fan disposed within the enclosure and external to the heat generating module.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a block diagram of an example enclosure including a heat collector and a heat generating module having an internal fan to circulate air according to one example embodiment of the present disclosure.

FIG. 2 is a block diagram of an example embodiment of an enclosure including two heat generating modules and a heat collector.

FIG. 3 is a block diagram of another example embodiment of an enclosure including a solar shield, two heat generating modules, and a heat collector.

FIG. 4 is a block diagram of another example embodiment of an enclosure including two heat generating modules, a heat collector, and a block plate positioned between one of the heat generating modules and a top of the enclosure.

Corresponding reference numerals indicate corresponding parts or features throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

An enclosure according to one example embodiment of the present disclosure is illustrated in FIG. 1 and indicated generally by reference number 100. As shown in FIG. 1, the enclosure 100 includes a top portion 101, a bottom portion 103 opposing the top portion, and a heat generating module 102 adjacent the top portion of the enclosure. The heat generating module 106 includes an inlet side 104, an outlet side 106, a heat generating component 108 and an internal fan 110. The enclosure 100 also includes a heat collector 112 positioned adjacent the outlet side 106 of the heat generating module 102. The heat collector 112 is configured to collect warm air 114 from the outlet side 106 of the heat generating module 102 and divert the warm air to the bottom portion 103 of the enclosure to mix with cooler air. The internal fan 110 of the heat generating module 102 is configured to draw the mixed air 116 into the heat generating module 102 to create an airflow loop within the enclosure 100 to cool the heat generating component 108 without a heat sink, a heat exchanger, or a fan disposed within the enclosure and external to the heat generating module.

As shown in FIG. 1, the internal fan 110 may be positioned within the heat generating module 102 between the inlet side 104 and the outlet side 106. For example, the internal fan 110 may be positioned adjacent a midpoint between the inlet side 104 and the outlet side 106, near the inlet side 104 (as shown in FIG. 1), near the outlet side 106, at the inlet side 104, at the outlet side 106, between the heat generating component 108 and the inlet side 104, between the heat generating component 108 and the outlet side 106, etc.

The internal fan 110 may be any fan suitable for drawing air into the heat generating module 102 via the inlet side 104, directing the air across the heat generating module 108, and transferring the air out of the heat generating module 102 via the outlet side 106. For example, the internal fan 110 may be a cooling fan of the heat generating module 102 configured to cool the heat generating component 108 during operation.

The inlet side 104 and the outlet side 106 may each have one or more openings to allow air to enter/exit the heat generating module 102. For example, the inlet side 104 and/or the outlet side 106 may include an opening covered by a screen, bars, and/or another suitable filter to allow air to enter the heat generating module 102 while inhibiting entry of contaminating particles and/or other objects that could interfere with operation of the heat generating module.

As explained above, the heat collector 112 is disposed adjacent the outlet side 106 of the heat generating module 102. The heat collector 112 collects warm air 114 from the outlet side 106 of the heat generating module 102 and diverts the warm air to the bottom portion 103 of the enclosure 100 to mix with cooler air. For example, the heat collector 112 may include a duct, column, tube, tunnel, etc. with an opening at the outlet side 106 such that the warm air exiting the outlet side may directly enter the heat collector. The warm air 114 may then be diverted down the heat collector 112 (e.g., via pressure from the interior fan 110, etc.) until it exits the heat collector at an opening of the heat collector adjacent the bottom portion 103 of the enclosure 100.

The heat collector 112 may include any suitable duct, column, tube, tunnel, etc. capable of diverting air from one location to another. FIG. 1 illustrates the heat collector 112 as including a single duct, but other embodiments may include more than one duct, a single duct divided into multiple segments and/or channels, etc. The heat collector 112 may comprise any suitable material (e.g., aluminum, steel, etc.) and may include material designed to enhance thermal conductivity between the warm air 114 and the rest of the enclosure to cool the warm air 114 faster.

As shown in FIG. 1, the heat collector 112 extends from the outlet side 106 of the heat generating module 102 to the bottom portion 103 of the enclosure 100. As such, the warm air 114 passing through the heat collector 112 is able to exit the heat collector 112 adjacent a bottom portion 103 of the enclosure 100. The bottom portion 103 of the enclosure 100 may include cooler air that has sunk to the bottom based on thermodynamic properties inside the enclosure, cooler air that has not recently traveled through the heat generating module 102, etc. As such, the air temperature near the bottom wall of the enclosure is generally cooler than the air temperature near the top portion 101 of the enclosure, a middle portion of the enclosure (e.g., an area near the top of the bottom portion 103), etc.

In some embodiments, the heat collector 112 may extend a distance of about half the height of the enclosure (e.g., an area near the top of the bottom portion 103, etc.). In other embodiments, the heat collector 112 may extend a distance more or less than about half the height of the enclosure. For example, the heat collector 112 may extend to a position substantially even with the bottom wall (e.g., a floor, etc.) of the enclosure 100. As such, the heat collector 112 causes the warm air 114 to travel to the bottom of the enclosure where the existing air is generally cooler than other portions of the enclosure as explained above. As a result, the air 114 may begin to cool after mixing with the cooler air at the bottom of the enclosure 100 and before it is drawn back into the heat generating module 102.

Once the warm air 114 exits the heat collector 112 adjacent the bottom portion 103 of the enclosure 100, the warm air 114 mixes with the cooler air. This mixture of air (referred to as the mixed air 116) is generally cooler than the warm air 114 exiting the heat collector 112.

The internal fan 110 of the heat generating module 102 draws the mixed air 116 from the bottom portion 103 of the enclosure 100 upward to the top portion 101 of the enclosure, and into the heat generating module via the inlet side 104. This may create an airflow loop within the enclosure 100 to cool the heat generating module 102 without using a heat sink, heat exchanger, a fan external to the heat generating module but inside the enclosure, etc. For example, some enclosures may require a heat sink, heat exchanger, etc. to cool air after it is displaced from a heat generating module. Other enclosures may require a fan which is external to the heat generating module but still inside the enclosure in order to circulate air though the enclosure. The internal fan 110, however, reduces the need for these types of components as the internal fan is capable of creating an airflow inside the enclosure 100 using its own generated air pressure and airflow. As such, some or all of these components may be eliminated from the enclosures disclosed herein. This may reduce costs, increase efficiency, save space, etc. compared to other known enclosures including one or more heat sinks, heat exchangers, external fans, etc.

The enclosure 100 may be any suitable enclosure including a cabinet, telecommunications enclosure, server enclosure, power system(s) enclosure, etc. The enclosure 100 may comprise any suitable material (e.g., steel, aluminum, etc.) and may house any suitable electronics equipment (e.g., power converters, rectifiers, inverters, etc.). The enclosure 100 comprises a rectangular shape having a top, a bottom, and four sides. Other example embodiments may have different shapes. The enclosure 100 may be a sealed enclosure, such that outside air, water, insects and/or other contaminants are inhibited from entering into the enclosure. The enclosure 100 may be sealed by having integrally formed top, bottom, sides, etc., may have seals at joint potions of adjacent panels, may not include any vents/openings for allowing outside air to enter, etc.

As mentioned above, the heat generating module 102 and any other components may be positioned in the top portion 101 of the enclosure 100. For example, the top portion 101 may include approximately the upper half of the enclosure 100. As shown in FIG. 1, the top potion 101 includes the portion of the enclosure 100 having the heat generating module 102. The bottom portion 103 of the enclosure 100 may generally include open space and/or electrical equipment 105 (e.g., batteries, power converters, etc.) adjacent a bottom of the enclosure 100. The warm air 114 may pass through the electrical equipment 105 and any other open space in the bottom portion 103 as it mixes with cooler air. For example, the bottom portion 103 may include approximately the bottom half of the enclosure 100. As shown in FIG. 1, the bottom portion 103 of the enclosure 100 includes the space below the heat generating module 102. In some embodiments, the top portion 101 and bottom portion 103 may be physically separated by structure, may be divided by equipment within the enclosure 100, etc.

The heat generating module 102 may include any electronic equipment capable of generating heat during operation. For example, the heat generating module 102 may include one or more heat generating components (e.g., the component 108, etc.) that generate heat during operation due to inefficiency and/or power losses. In some examples, the heat generating module 102 may include one or more power conversion components (e.g., DC/DC converters, AC/DC rectifiers, inverters, etc.). As such, the heat generating module 102 may be considered a power converter module, a rectifier module, an inverter module, etc. depending on, for example, the heat generating component and/or the combination of heat generating components (e.g., converters, rectifiers, inverters, etc.) housed within the module 102.

Although FIG. 1 illustrates the enclosure 100 as including one heat generating module 102, it should be apparent the enclosures disclosed herein may include more than one heat generating module. For example, FIG. 2 illustrates another enclosure 200 substantially similar to the enclosure 100 of FIG. 1, but including two heat generating modules and a heat collector 212. In particular, the enclosure 200 of FIG. 2 includes the heat generating module 102 of FIG. 1 and another heat generating module 202 substantially similar to the module 102. For example, and as shown in FIG. 2, the heat generating module 202 includes an inlet side 204, an outlet side 206, a heat generating component 208, and an internal fan 210. The internal fan 210 may function similar to the fan 110 (e.g., drawing air into the heat generating module 202 via inlet side 204, diverting air out of the heat generating module via outlet side 206, etc.).

In addition to collecting warm air 114 exiting the heat generating module 102, the heat collector 212 may be adjacent to the outlet side 206 of the heat generating module 202 to collect warm air 114 exiting the heat generating module 202 and divert the warm air 114 to the bottom portion 103 of the enclosure 100. The heat collector 212 may include multiple openings each corresponding to one of the outlet sides 106, 206, may include a single opening corresponding to both outlet sides 106, 206, etc.

The heat generating module 202 is shown in FIG. 2 as positioned directly below the heat generating module 102 with no gap therebetween. Alternatively, the heat generating module 202 may be located above the heat generating module 102, beside the first heat generating module 102, etc. In other embodiments, there may be a gap between the heat generating module 102 and the heat generating module 202.

Additionally, and as shown in FIG. 2, the heat collector 212 may include a single duct for collecting warm air 114 from both outlet sides 106, 206 of the modules 102, 202, respectively. In other embodiments, separate ducts or the like may be employed for collecting the warm air from the different outlet sides 106, 206 of the modules 102, 202.

Warm air collected from outlet sides of heat generating modules may be heated due to sunlight as the warm air travels down to the bottom portion of the enclosure. In some embodiments, one or more solar shields may be used adjacent an outer surface of the enclosure to reflect sunlight and reduce the heating effects from sunlight on the warm air that exits the heat generating modules. As an example, enclosure 300 of FIG. 3 is substantially similar to the enclosure 100 of FIG. 1, but includes a rear solar shield 332 adjacent a rear side of the enclosure and a front solar shield 334 adjacent the front side of the enclosure.

Each solar shield 332, 334 may comprise any material suitable for reflecting sunlight (e.g., have a reflection coefficient suitable for reflecting sunlight, etc.) to reduce heat generated due to sunlight absorbed by the enclosure 300.

Heat collector 312 may be substantially similar to the heat collectors 112, 212 of FIGS. 1 and 2, but may divert air to the bottom portion of the enclosure 300 via the rear solar shield 332. The heat collector 312 may not extend beyond the top portion of the enclosure 300, beyond the bottom of any heat generating modules, etc. and may have an open portion to divert air into the rear solar shield 332.

The rear solar shield 332 is adjacent the outlet sides of the heat generating modules 102 and 202 and the heat collector 312. In this example embodiment, the heat collector 312 diverts warm air 114 collected from the outlet sides of the heat generating modules 102 and 202 into the solar shield 332. For example, after warm air 114 is collected by the heat collector 312, it may be diverted into a duct, column, tube, tunnel, etc. of the solar shield 332, which may then divert the warm air into a bottom portion of the enclosure 300. As such, collector 312 diverts air to the bottom portion of the enclosure 300 via solar shield 332.

In some embodiments, the enclosure 300 may be partially or substantially covered with a material having a high reflection coefficient (e.g., a white paint, etc.). This may inhibit heating of the enclosure via absorbed sunlight. The surface(s) of the enclosure 300 may be formed of a high reflection coefficient material, have a high reflection coefficient material applied to the surface(s), etc. Although two solar shields 332, 334 are positioned on rear and front sides of the enclosure 300 are illustrated in FIG. 3, other embodiments may include more or less solar shields, solar shields adjacent other sides of the enclosure 300, etc.

FIG. 4 is similar to FIG. 3, but the enclosure 400 includes a block plate 436. The block plate 436 extends above the heat generating module 102 to a top of the enclosure 400. The block plate 436 is configured to inhibit warm air 114 from the outlet sides of the heat generating modules 102 and 202 from being directly recirculated to the inlet sides of the heat generating modules. For example, the block plate 436 may prevent warm air 114 from traveling out of the outlet sides, over the top of the heat generating module 102, and directly back into the inlet sides before the warm air can cool. Thus, the block plate 436 may assist in forcing warm air 114 into the heat collector 312 such that the warm air is directed to the bottom of the enclosure 400 to mix with cooler air.

The block plate 436 may comprise any material suitable for preventing air from flowing through the block plate, such as aluminum, steel, plastic, etc. Although FIG. 4 illustrates one block plate 436 as extending from heat generating module 102 up to the top of the enclosure 400, in other embodiments one or more block plates may extend down from one or more heat generating modules, out from the side of one or more heat generating modules, between at least two heat generating modules, etc. The block plate 436 may also be used in embodiments not including a solar shield, embodiments having more or less heat generating modules, etc.

As described above, one or more heat generating modules may include one or more interior fans configured to create an airflow to circulate air through the enclosure, thereby causing warm air at the outlet side(s) to travel through the heat collector to the bottom portion of the enclosure where the warm air can mix with cooler air before being drawn back into the inlet side(s) of the heat generating module(s). This may inhibit recirculation of warm air from the outlet side(s) directly to the inlet side(s) and provide cooler air to the inlet side(s) thereby ensuring temperatures at the inlet side(s) are suitable for safe, proper, etc. operation of the heat generating component(s) and/or other components in the module(s). For example, the temperature of the mixed air drawn into the inlet side(s) may be less than or equal to about 65 degrees Celsius in some embodiments. The airflow may also generate a substantially uniform temperature throughout the enclosure, as the warm air is continually mixed with cooler air in the bottom portion of the cabinet.

Testing has shown the enclosures disclosed herein exhibit improved thermal conditions as compared to known enclosures. For example, an enclosure having two heat generating modules without a heat collector were tested to have inlet side temperatures of about 68 degrees Celsius and about 69 degrees Celsius and outlet side temperatures of about 72 degrees Celsius and about 73 degrees Celsius, respectively. Thus, the air moving through the modules warmed by about four degrees while traveling through the heat generating modules.

When a heat collector (e.g. the heat collector 112, 212, 312 and/or another suitable heat collector) was added to the enclosure, the inlet side temperatures decreased to about 67 degrees Celsius and about 66 degrees Celsius, respectively, and both outlet side temperatures decreased to about 71 degrees Celsius. This indicates an improvement of lower temperatures when the heat collector is added. As such, because air introduced into and passing through the modules is cooler, the heat generating components and/or other components within the modules may experience improved performance, operation, etc. compared to enclosures not having a heat collector. Additionally, the possibility of malfunction due to overheating of the components may be reduced.

If a solar shield (e.g. the solar shield 332 and/or another suitable solar shield) is added to the enclosure and the heat collector is ducted into the solar shield, the inlet side temperatures may lower to about 64 degrees Celsius and about 65 degrees Celsius, respectively, and the outlet side temperatures may lower to about 69 degrees Celsius and 70 degrees Celsius, respectively. Thus, adding the solar shield may further reduce the temperature of air passing through the heat generating modules.

Testing has also shown the heat collector may further decrease temperatures adjacent the modules by making the heat collector and/or the enclosure of an appropriate material (e.g., aluminum, etc.), by placing another material over at least a portion of the heat collector and/or the enclosure (e.g., paint, a thermally insulated cover, etc.). For example, testing has shown an off white painted enclosure having two rectifier modules (each providing 44W to a load) with no heat collector had inlet side temperatures of about 75 degrees Celsius and about 73 degrees Celsius, respectively, and outlet side temperatures of about 79 degrees Celsius and about 77 degrees Celsius, respectively. Adding a heat collector (e.g. the heat collector 112, 212, 312 and/or another suitable heat collector) painted with the off white color adjacent the two heat generating modules reduced the inlet side temperatures to about 68 degrees Celsius for both modules and the outlet side temperatures to about 74 degrees Celsius and 73 degrees Celsius, respectively.

Similarly, testing has shown a white painted enclosure having two rectifier modules (each providing 44W to a load) with no heat collector had inlet side temperatures of about 67 degrees Celsius and about 66 degrees Celsius, respectively, and outlet side temperatures of about 71 degrees Celsius and about 70 degrees Celsius, respectively. Adding a heat collector (e.g. the heat collector 112, 212, 312 and/or another suitable heat collector) painted with the white color adjacent the two heat generating modules reduced the inlet side temperatures to about 61 degrees Celsius for both modules and the outlet side temperatures to about 67 degrees Celsius and 66 degrees Celsius, respectively.

According to another example embodiment, a method of managing heat inside an enclosure is disclosed. The enclosure includes a heat generating module and a heat collector adjacent an outlet side of the heat generating module. The method includes collecting warm air with the heat collector from the outlet side of the heat generating module, diverting the warm air with the heat collector to a bottom portion of the enclosure to mix with cooler air, and drawing the mixed air into the heat generating module via an interior fan of the heat generating module to create an airflow loop within the enclosure to cool the heat generating component without a heat sink, a heat exchanger, or a fan disposed within the enclosure and external to the heat generating module.

If the enclosure includes first and second heat generating modules, collecting warm air may include collecting warm air with the heat collector from the outlet side of the first heat generating module, and collecting warm air with the heat collector from the outlet side of the second heat generating module.

Drawing mixed air into the heat generating module may include drawing the mixed air through an inlet side of the heat generating module, drawing the mixed air across a heat generating component disposed within the heat generating module, and diverting the air out of the heat generating module via the outlet side of the heat generating module.

The method may also include inhibiting warm air from the outlet side of the heat generating module from being directly recirculated back to the inlet side of the heat generating module. This may be accomplished by employing a blocking device such as a solid plate (e.g., the block plate 436 of FIG. 4 and/or another suitable plate), etc.

It should be apparent that the example methods may be performed using example enclosures described herein, but are not limited to those enclosures. Also, the enclosures described herein may be configured to perform the above example methods, but are not required to perform these methods.

Aspects of the present disclosure may provide for one or more of the following advantages: reducing recirculation of warm air exhausting the outlet side of the heat generating module to the inlet side of the heat generating module, maintaining uniform temperature throughout the enclosure, reducing costs, etc. For example, because the enclosures do not need heat sinks, heat exchangers, or external fans to manage heat as explained above, production and/or maintenance costs associated with those components may be reduced, power consumption may be reduced, acoustic noise (e.g., from the external fan) may be reduced, etc. Further, the components of the enclosures may be more reliable as they do not rely on an external fan (which may fail) for cooling.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An enclosure comprising:
a top portion;
a bottom portion opposing the top portion;
at least one heat generating module adjacent the top portion of the enclosure, the heat generating module having an inlet side, an outlet side, a heat generating component and an internal fan; and
a heat collector positioned adjacent the outlet side of the heat generating module between the heat generating module and a sidewall of the enclosure, and defining a channel having a closed upper end and extending from the heat generating module to a bottom portion of the module, the heat collector configured to collect warm air from the outlet side of the heat generating module and channel the warm air to the bottom portion of the enclosure to mix with cooler air while inhibiting the warm air from recirculating over a top of the heat generating module, the internal fan of the heat generating module configured to draw the mixed air into the inlet side of the heat generating module to create an airflow loop within the enclosure to cool the heat generating component without a heat sink, a heat exchanger, or a fan disposed within the enclosure external to the heat generating module, wherein the enclosure is sealed to inhibit outside air, water, insects and/or other contaminants from entering the enclosure.

2. The enclosure of claim 1, wherein the internal fan of the heat generating module is configured to draw the mixed air through the heat generating module, divert the air across the heat generating component, and push the warm air out from the outlet side.

3. The enclosure of claim 1, wherein the at least one heat generating module is a first heat generating module, the system further comprising a second heat generating module adjacent the top portion of the enclosure, the second heat generating module having an inlet side, an outlet side adjacent the heat collector, a heat generating component and an internal fan, the internal fan of the second heat generating module configured to draw the mixed air into the second heat generating module.

4. The enclosure of claim 3, wherein the second heat generating module is disposed below the first heat generating module.

5. The enclosure of claim 1, wherein the heat generating module includes a rectifier module and the heat generating component includes a rectifier.

6. The enclosure of claim 1, wherein the temperature of the mixed air drawn into the inlet side of the heat generating module is less than or equal to about 65 degrees Celsius.

7. The enclosure of claim 1, wherein the internal fan of the heat generating module and the heat collector are configured to maintain the airflow loop within the enclosure such that the temperature throughout the enclosure is substantially uniform.

8. The enclosure of claim 1, wherein the internal fan of the heat generating module and the heat collector are configured to maintain the airflow loop within the enclosure such that recirculation of warm air from the outlet side of the heat generating module directly to the inlet side of the heat generating module is inhibited.

9. The system of claim 1, wherein the enclosure includes a plurality of sides, the enclosure further comprising a solar shield adjacent at least one side of the plurality of sides of the enclosure.

10. The system of claim 1, wherein the enclosure includes a top side, and a bottom side opposing the top side, the enclosure further comprising a plate extending between the heat generating module and the top side of the enclosure to further inhibit warm air from the outlet side of the heat generating module from directly recirculating into the inlet side of the heat generating module.

11. The system of claim 1, wherein the enclosure includes a plurality of exterior sides, and wherein at least one side of the plurality of sides includes a desired reflection coefficient to reflect heat from sunlight.

12. An enclosure comprising:
a top portion;
a bottom portion opposing the top portion;
a plurality of sides;
a solar shield adjacent at least one of the plurality of sides;
at least one heat generating module adjacent the top portion of the enclosure, the heat generating module having an inlet side, an outlet side, a heat generating component and an internal fan; and a heat collector positioned adjacent the outlet side of the heat generating module, the heat collector configured to collect warm air from the outlet side of the heat generating module and channel the warm air to the bottom portion of the enclosure to mix with cooler air, the internal fan of the heat generating module configured to draw the mixed air into the inlet side of the heat generating module to create an airflow loop within the enclosure to cool the heat generating component without a heat sink, a heat exchanger, or a fan disposed within the enclosure external to the heat generating module, the solar shield adjacent the outlet side of the heat generating module and the heat collector, the heat collector configured to channel at least some warm air collected from the outlet side of the heat generating module to the solar shield.

13. The enclosure of claim 12, wherein:
the at least one heat generating module includes at least two heat generating modules adjacent the top portion of the enclosure;
each heat generating module has an inlet side, an outlet side, a heat generating component and an internal fan; and
the heat collector is positioned adjacent the outlet side of each heat generating module.

14. A method of managing heat inside an enclosure, the enclosure including a first heat generating module, a second heat generating module and a heat collector adjacent an outlet side of the first heat generating module and an outlet side of the second heat generation module, the method comprising:
collecting warm air with the heat collector from the outlet side of the first heat generating module and from the outlet side of the second heat generating module;
channeling the warm air with the heat collector to a bottom portion of the enclosure to mix with cooler air while inhibiting the warm air from recirculating over a top of the first heat generating module and a top of the second heat generating module; and
drawing the mixed air into the first heat generating module via an interior fan of the first heat generating module and into the second heat generating module via an interior fan of the second heat generating module to create an airflow loop within the enclosure to cool the first heat generating module and the second heat generating module without a heat sink, a heat exchanger, or a fan disposed within the enclosure and external to the first heat generating module and the second heat generating module, wherein the enclosure is sealed to inhibit outside air, water, insects and/or other contaminants from entering the enclosure.

15. The method of claim 14, wherein drawing the mixed air into the first heat generating module via an interior fan includes drawing the mixed air through an inlet side of the first heat generating module, the method further comprising:
drawing the mixed air across a heat generating component disposed within the first heat generating module; and
diverting the mixed air out of the first heat generating module via the outlet side of the first heat generating module.

16. The method of claim 14, further comprising:
inhibiting warm air from the outlet side of the first heat generating module from being directly recirculated back to the inlet side of the first heat generating module.

17. The method of claim 14, wherein the heat collector is positioned between a sidewall of the enclosure and the first and second heat generating modules.

18. The method of claim 14, wherein the heat collector defines a channel extending from the outlet side of the first and second heat generating modules to the bottom portion of the enclosure.

19. The method of claim 14, wherein the channel has a closed upper end.

20. The method of claim 14, wherein the enclosure includes a solar shield adjacent at least one side of the enclosure.

* * * * *